United States Patent
Guo et al.

(10) Patent No.: US 11,042,500 B1
(45) Date of Patent: Jun. 22, 2021

(54) SYSTEMS AND METHODS FOR HIGH-SPEED DATA TRANSFER OVER A COMMUNICATION INTERFACE

(71) Applicant: CADENCE DESIGN SYSTEMS, INC., San Jose, CA (US)

(72) Inventors: Xiaolei Guo, San Jose, CA (US); Mitchell Poplack, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 3 days.

(21) Appl. No.: 16/721,656

(22) Filed: Dec. 19, 2019

(51) Int. Cl.
*G06F 9/30* (2018.01)
*G06F 13/42* (2006.01)
*G06F 13/16* (2006.01)
*G06K 9/62* (2006.01)
*G06F 13/10* (2006.01)

(52) U.S. Cl.
CPC ...... *G06F 13/4291* (2013.01); *G06F 9/30101* (2013.01); *G06F 13/102* (2013.01); *G06F 13/1642* (2013.01); *G06K 9/6256* (2013.01)

(58) Field of Classification Search
None
See application file for complete search history.

(56) References Cited

U.S. PATENT DOCUMENTS

2009/0167375 A1* 7/2009 Miki ............... G06F 1/0321
327/117

* cited by examiner

*Primary Examiner* — Scott C Sun
(74) *Attorney, Agent, or Firm* — Foley & Lardner LLP

(57) ABSTRACT

A SPI master may configure a set of hardware registers associated with a SPI client with a set of communication parameters. The SPI master may send a message to the SPI client. The SPI master may periodically ping the SPI client until the SPI master receives an acknowledgement message from the SPI client in response to the message from the SPI master. The SPI master may periodically ping the SPI client based upon the set of communication parameters. The SPI client may transmit the acknowledgement message to the SPI master based upon the set of communication parameters. The SPI master may receive the acknowledgement message from the SPI client. The SPI master may determine a status of a read operation or a write operation associated with the message based upon the acknowledgement message.

20 Claims, 11 Drawing Sheets

200

300

CPHA = 0

600

700

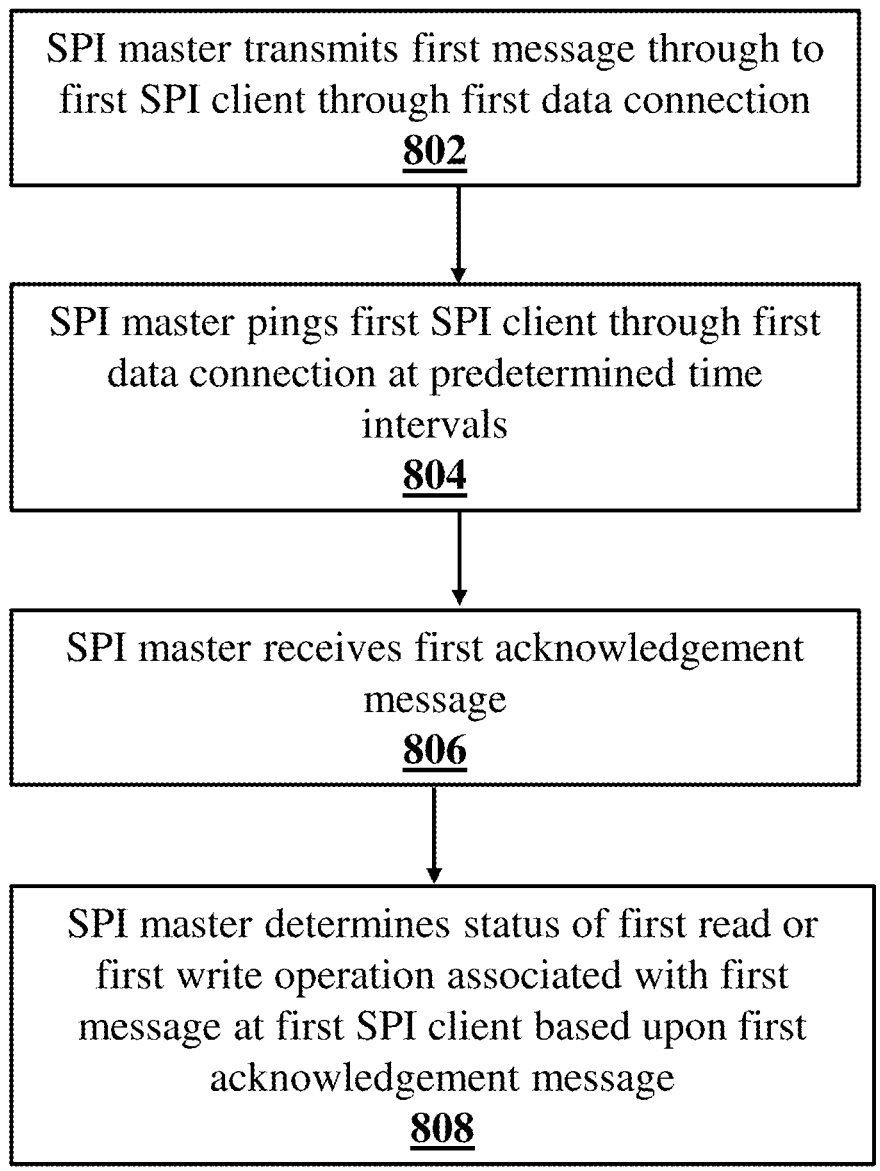

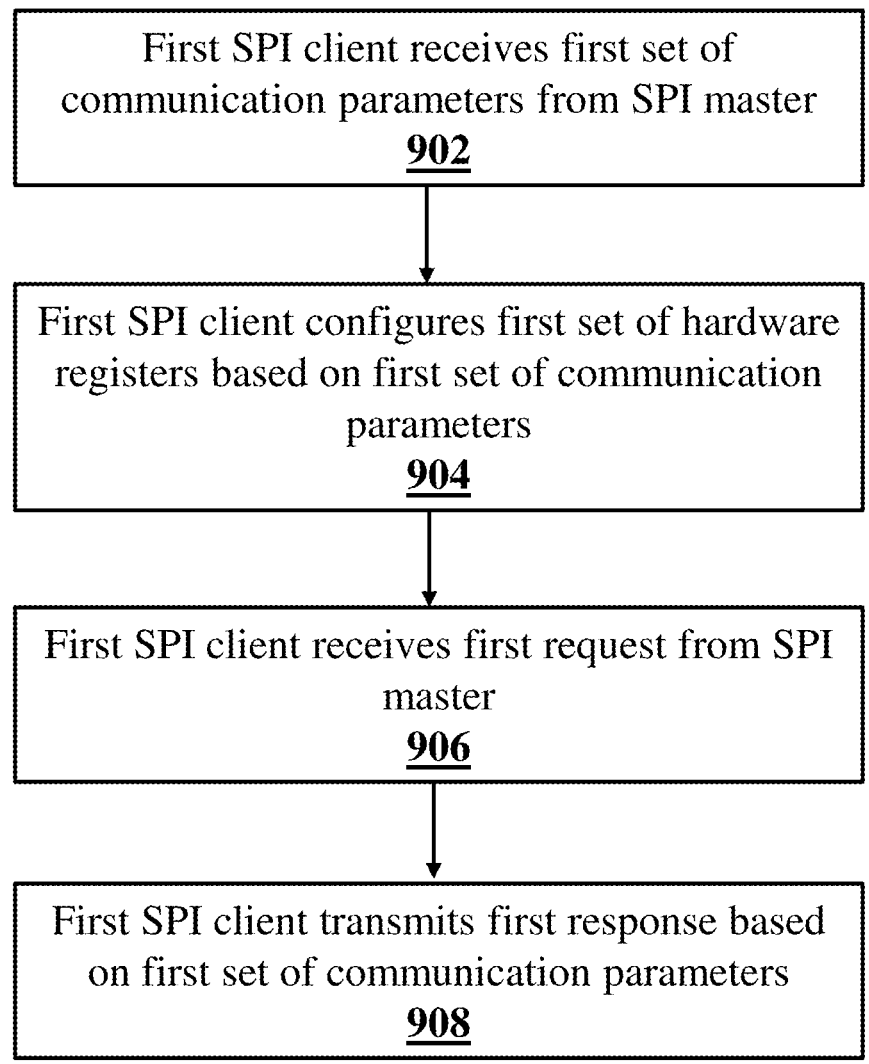

SYSTEMS AND METHODS FOR HIGH-SPEED DATA TRANSFER OVER A COMMUNICATION INTERFACE

TECHNICAL FIELD

This application is generally directed towards processor-based emulation systems, and more specifically towards communicating with clients having a non-deterministic response delay over a communication interface, such as a serial peripheral interface (SPI).

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of the EDA tools is emulation of a user's logical system (e.g., an IC design) to perform pre-silicon functional verification, firmware and software development, and post-silicon debug. To achieve this, a typical processor-based emulation system comprises several Application Specific Integrated Circuits (ASICs), often referred to as emulation ASICs or emulation chips, all working together to execute a program generated by an emulation compiler generated from the user's IC design. The compiled program models a design under test (DUT) that is a logical representation of the user's IC design running on several emulation ASICs of the emulation system.

Emulation ASICs may communicate with each other via communication links, such as copper traces carrying data in a circuit board or optical cables carrying data across circuit boards. The communication links often carry serialized data, although the data may be generated and/or consumed in parallel. Therefore, an input/output (I/O) communication interface at a transmit side serializes parallel data prior to transmission and another I/O communication interface at a receive side parallelizes received serial data. An SPI is an I/O communication interface that serializes parallel data, transmits serialized data, receives serialized data, and parallelizes the received data.

Two or more devices (for example, emulation ASICs or any other electronic devices) may use their corresponding SPIs for communication. For instance, a master emulation ASIC having a corresponding SPI master may communicate with a client emulation ASIC having a corresponding SPI client using the SPI master and the SPI client. The SPI master may control the SPI client such that the SPI master may initiate communication with the SPI client. Data may be moved between the SPI master and the SPI client based on a clock signal generated by the SPI master. Using the clock signal as a reference, the SPI master sends one bit of data at a time to the SPI client. When the SPI client reads the bits of data sent by the SPI master, the SPI client sends one bit of data at a time back to the SPI master. Using the generated clock signal as the reference, the SPI master reads the bits of data sent by the SPI client.

Typically, the SPI master and the SPI client may send the data over a communication channel on one transition (e.g., rising edge) of the clock and read the data in the opposite transition (e.g., falling edge) of the clock. However, when capturing of the data at both the SPI master and the SPI client uses opposite ends of the clock, it limits the clock rate with a round-trip delay time. Thus, the SPI client is severely constrained to meet shorter response time in its design and implementation to support the specified clock rate.

During the communication process, the SPI master may implement write and read commands. The write commands are "fire-and-forget" commands. When the SPI master implements the write commands, there is an implied assumption that the SPI client will successfully receive and complete write tasks associated with the write commands, and there is no technique to confirm the status of the write tasks. Similarly, when the SPI master implements the read commands, there is an implied assumption that the SPI client will successfully receive and complete read tasks associated with the read commands, and send requested read data. There is no technique to confirm the status of the read tasks. When the SPI master may receive the read data from the SPI client, there is no mechanism to confirm whether the read data is valid.

Furthermore, during each transaction between the SPI master and the SPI client, the SPI master does not know whether the SPI client is functional or non-functional. As a result, when the SPI client is non-functional, the SPI client cannot execute tasks associated with received commands and the SPI master is incapable of knowing that the SPI client is non-functional.

SUMMARY

What is therefore desired are communication interface enabled devices with a communication protocol for a communication interface master to configure one or more communication interface clients to transmit back status messages based upon communication parameters. What is further desired are the one or more communication interface clients that may provide hardware registers to the communication interface master for setting the communication parameters. What is also desired are the one or more communication interface clients that may send its response data at a programmable time with respect to a whole transaction framing such that there is no round-trip delay time constraint on a clock rate. The communication interface enabled devices may be for emulation ASICs or any other electronic devices. As an example, the communication interface may be an SPI or any other communication interface, particularly those that transmit status messages without client acknowledgements.

What is further desired are one or more client devices associated with one or more communication interface clients where the one or more client devices may have unknown response times and the one or more communication interface clients may send its response data at a known time based on a communication protocol. A communication interface master may ping the one or more communication interface clients based on the communication protocol until an internal transaction between the one or more communication interface clients and the one or more client devices may be completed. Although an example within this disclosure recites emulation ASICs, it is intended that the communication interface may configured to operate with any electronic devices.

To ensure a reliable communication between a communication interface master (for example, a SPI master) and its one or more communication interface clients (for example, one or more SPI clients), the SPI master may configure one or more hardware registers associated with the one or more SPI clients with one or more communication parameters. When the one or more hardware registers associated with the one or more SPI clients are configured, the SPI master may initiate communication and send a message to the one or more SPI clients. The SPI master may periodically ping the one or more SPI clients until the SPI master receives an acknowledgement message from the one or more SPI clients, in response to the message. The SPI master may periodically ping the one or more SPI clients based upon a first communication parameter (for example, a predetermined time interval) configured by the SPI master in the one or more hardware registers associated with the one or more SPI clients. The one or more SPI clients may send the acknowledgement message to the SPI master based upon a second communication parameter (for example, a programmable time, a sample rate, etc.). The SPI master may receive the acknowledgement message and determine a status of a read operation or a write operation associated with the message based upon the acknowledgement message.

In an embodiment, a method of communication between communication interface enabled devices may include preconfiguring, by a communication interface master, a first set of hardware registers associated with a first communication interface client with a first set of communication parameters; transmitting, by the communication interface master to the first communication interface client, a first message through a first data connection between the communication interface master and the first communication interface client; periodically pinging, by the communication interface master, the first communication interface client through the first data connection at predetermined time intervals as indicated by at least one communication parameter of the first set of communication parameters; and upon the communication interface master receiving a first acknowledgement message in response to the first message, determining, by the communication interface master, a status of a first read or a first write operation associated with the first message at the first communication interface client based upon the first acknowledgement message.

In another embodiment, an emulation system may include a communication interface master and a first communication interface client. The communication interface master is configured to preset a first set of communication parameters in a first set of hardware registers associated with the first communication interface client; transmit a first message to the first communication interface client through a first data connection between the communication interface master and the first communication interface client; periodically ping the first communication interface client through the first data connection at predetermined time intervals as indicated by at least one communication parameter of the first set of communication parameters; and upon the communication interface master receiving a first acknowledgement message in response to the first message, determine a status of a first read or a first write operation associated with the first message at the first communication interface client based upon the first acknowledgement message.

In yet another embodiment, a method of communication between communication interface enabled devices may include receiving, by a first communication interface client from a communication interface master, a first set of communication parameters to configure subsequent communication between the first communication interface client and the communication interface master; configuring, by the first communication interface client, a first set of hardware registers associated with the first communication interface client based upon a received first set of communication parameters, wherein the first set of communication parameters comprises a first sampling rate and a first response delay; receiving, by the first communication interface client from the communication interface master, a first request through a first data connection between the communication interface master and the first communication interface client; and transmitting, by the first communication interface client to the communication interface master, a first response based on the first request and in accordance with the first set of communication parameters.

In yet another embodiment, an emulation system may include a first communication interface client and a communication interface master. The first communication interface client is configured to receive from the communication interface master a first set of communication parameters to configure subsequent communication between the first communication interface client and the communication interface master; configure a first set of hardware registers associated with the first communication interface client based upon a received first set of communication parameters, wherein the first set of communication parameters comprises a first sampling rate and a first response delay; receive from the communication interface master a first request through a first data connection between the communication interface master and the first communication interface client; and transmit to the communication interface master a first response based on the first request and in accordance with the first set of communication parameters.

BRIEF DESCRIPTION OF THE DRAWINGS

The accompanying drawings constitute a part of this specification and illustrate an embodiment of the subject matter described herein.

FIG. 8 is a flow diagram of a method of communication between SPI enabled devices, according to an embodiment.

FIG. 9 is a flow diagram of a method of communication between SPI enabled devices, according to an embodiment.

DETAILED DESCRIPTION

Figure 1:
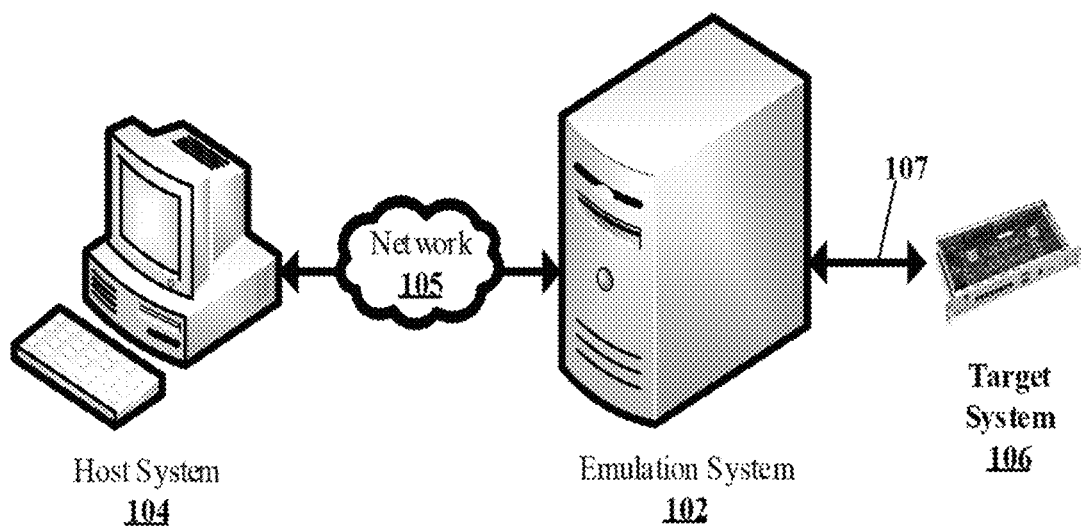
FIG. 1 shows an illustrative environment including an emulation system, according to an embodiment.

Embodiments disclosed herein describe a system (for example, an emulation system), which may include electronic devices (for example, emulation ASICs or emulation chips) that may contain a plurality of Boolean processors emulating different functions of a DUT. The emulation system may further include switching ASICs (or switching chips) that may switch and route data between the emulation ASICs. The data between the emulation ASICs and/or the switching ASICs may move through communication lanes, such as SPI lanes. A SPI lane transmit interface (for example, a SPI master) may have a transmit buffer that processing core of the ASICs (e.g., emulation ASIC or switching ASIC) writes data to be transmitted. Additionally, a SPI lane receive interface (for example, a SPI client) may have a receive buffer that the processing core may read the received data.

The emulation system may provide a reliable and a trustworthy communication between a communication interface master (for example, a SPI master) and one or more communication interface clients (for example, one or more SPI clients) by requesting an explicit acknowledgement message corresponding to a status such as, a completion status, an incomplete status, or a pending status of each transaction request from the one or more SPI clients. The emulation system may configure the one or more SPI clients with a deterministic response delay with a programmable wait time for receiving the acknowledgement message from the one or more SPI clients. The emulation system may configure the one or more SPI clients with a non-deterministic response delay with an automatic status polling from the SPI master upon receiving the acknowledgement message. The emulation system may enable the SPI master and the one or more SPI clients handshaking procedure for handling delayed acknowledgement messages from the one or more SPI clients.

The emulation system may be configured to run SPI at a faster speed by oversampling at the one or more SPI clients using an internal clock of the one or more SPI clients to ensure reliable data capture. The emulation system may enable the SPI master to write and adjust the one or more SPI clients transmission start time of their response frame. The emulation system may enable the SPI master to write and adjust the one or more SPI clients data output delay time to ensure reliable data capture. The emulation system may be configured to remove round-trip delay time constraint on a clock rate by allowing the one or more SPI clients to send their response data at a programmable time with respect to a whole transaction framing. The emulation system may be configured to accommodate the one or more SPI clients with various end-to-end path delays running at a same fast clock rate.

The emulation system may include the SPI master, which may select a first SPI client from the one or more SPI clients in order to communicate with the first SPI client. The SPI master may transmit a training instruction to the first SPI client. The first SPI client may receive the training instruction. The first SPI client may then send a training response comprising a known data pattern to the SPI master. The SPI master may receive and process the training response having the known data pattern to determine that the first SPI client is active. The SPI master 402 may use transmission characteristics associated with the training instruction and the training response to adjust the SPI master read capture time and the first SPI client output data delay time. The SPI master may access a set of hardware registers associated with the first SPI client. The SPI master may configure the set of hardware registers associated with the first SPI client with a set of communication parameters. In some instances, the first SPI client may receive the set of communication parameters from the SPI master, and the first SPI client may configure the set of hardware registers with the set of communication parameters. The set of communication parameters may at least include: (i) a predetermined time interval associated with the SPI master pinging, (ii) a programmable time associated with the first SPI client response, (iii) a predetermined sampling rate associated with the first SPI client response, and (iv) a predetermined response delay associated with the first SPI client response. Upon the configuration of the set of hardware registers associated with the first SPI client, the SPI master may communicate with the first SPI client. During this communication process, the SPI master may send a message to the first SPI client. Upon sending the message, the SPI master may wait for a specific amount of time to receive an acknowledgement message from the first SPI client, in response to the message. When the SPI master does not receive the acknowledgement message from the first SPI client during the specific amount of time, the SPI master may periodically ping the first SPI client until the SPI master receives the acknowledgement message from the first SPI client. The SPI master may ping the first SPI client after predetermined time intervals, which may be included within the set of communication parameters. The first SPI client may send the acknowledgement message to the SPI master at the programmable time based on the predetermined sampling rate and the predetermined response delay, which may be included within the set of communication parameters. The SPI master may receive and process the acknowledgement message to determine a status of a read operation or a write operation associated with the message.

The emulation system may provide an open framework for easy adaptation and/or expansion. The emulation system may provide the framework where the SPI master may determine and confirm completion status of each read transaction by the one or more SPI clients. The SPI master may further determine and confirm completion status of each write transaction by the one or more SPI clients. The SPI master may further determine and confirm whether read data received from the one or more SPI clients is valid. The SPI master may further determine and confirm whether the one or more SPI clients are non-functional. The emulation system may allow a SPI link to implement or run as fast as possible, and the SPI link may impose no constraints on how quickly the client SPI should complete any transaction (for example, the client SPI may complete the transaction in same cycle, next cycle, or any other subsequent cycle based on the preset communication parameters).

One or more operations are described herein as being implemented by a training processor. The training processor may be any processor or a portion thereof in the emulation system. For example, the training processor may be a processor that implements one or more training and hardware registers configuration operations when the emulation system is started. As another example, the training processor may be a combination of one or more controllers within the SPI master, the SPI client, or the processing core of the ASICs (e.g., emulation ASIC or switching ASIC) in the emulation system. The training processor may also be a compile processor that compiles and downloads one or more instructions to the emulation system to emulate the DUT. Regardless of the configuration of the training processor, the training processor may implement one or more training software modules to configure the hardware registers in the SPI client using the communication parameters as described in the embodiments disclosed herein.

FIG. 1 shows an illustrative environment 100 of an emulation system, according to an embodiment. The illustrative environment 100 may include an emulation system 102, a host system 104, a network 105, a target system 106, and a connection 107. The host system 104 may include one or more workstations that may run debug and runtime software interacting with the emulation system 102. The workstations may computing devices, such as desktop computers, laptop computers, tablet computers, and smartphones.

The emulation system 102 may include a combination of hardware and software modules, which may emulate a DUT. The emulation system 102 may include clusters of interconnected ASICs, non-transitory memory devices, buffers, data storage devices configured to provide a system platform for emulating the DUT. The clusters may be arranged in multiple boards. The boards may be arranged within multiple racks. Multiple racks may be arranged in a plurality of emulation devices, which may be analogous to multi-rack servers.

The target system 106 may include hardware modules configured to interact with the DUT being emulated. The target system 106 may include software modules configured to interact with the DUT being emulated. For example, if the DUT is a design of a graphics processing unit (GPU), the target system 106 may be a motherboard configured to receive the GPU after fabrication. The target system 106 may be an external hardware environment provided by a user.

The network 105 may be a communication link facilitating communication between the host system 104 and the emulation system 102. For example, the network 105 may include a local area network (LAN), a metropolitan area network (MAN), a wide area network (WAN), and/or Internet. The connection 107 may be a communication link configured to facilitate a communication with the emulation system 102 and the target system 106.

The above described systems 102, 104, 106 of the environment 100 are merely illustrative and other configuration should be considered to be within the scope of this disclosure. For example, the network 105 may include the connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 105 using a remote access protocol, such as internet protocol (IP).

Figure 2:
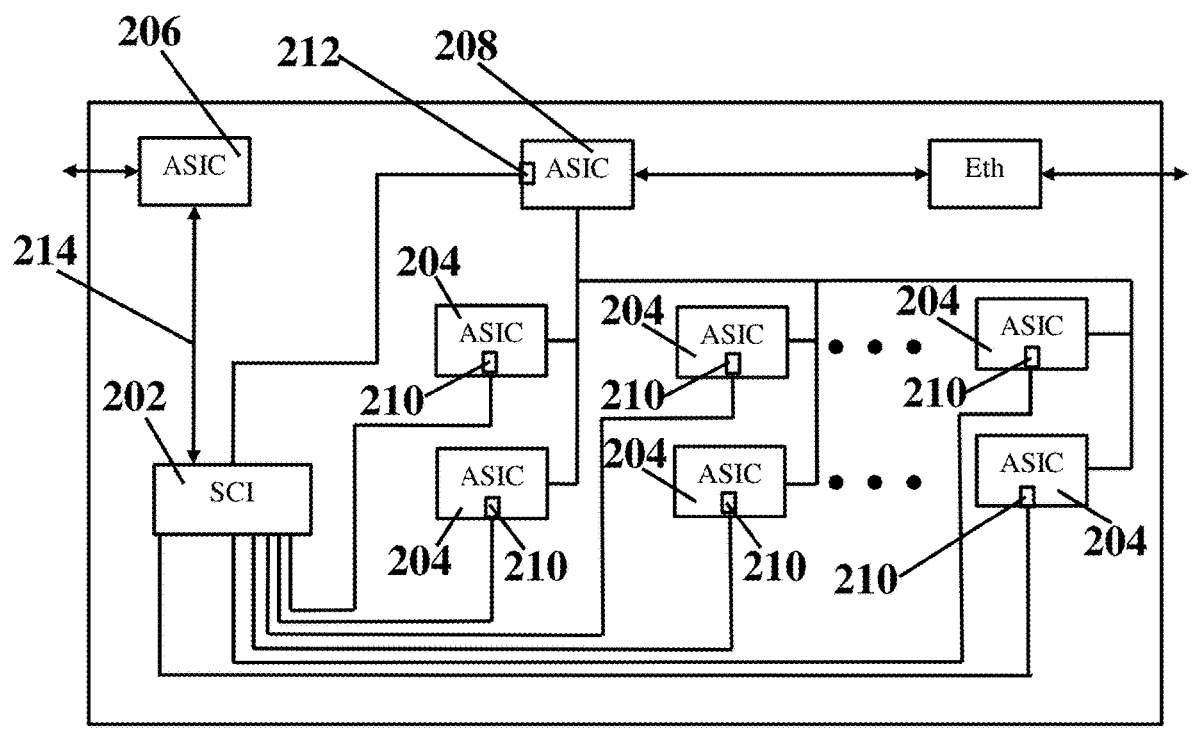
FIG. 2 shows an architecture of an emulation system having one or more SPI masters and one or more SPI clients, according to an embodiment.

FIG. 2 shows an architecture 200 of a switched control interface (SCI) field programmable gate array (FPGA) of an emulation system. The SCI FGPA may include one or more reference input clocks. The SCI FGPA may implement one or more types of reset commands, which may reset logics within each module of the SCI FGPA. A first reset command may be useful to reset the SCI FPGA core logic. A second reset command may be useful to reset and restart individual SPI linkup.

The emulation system may include a SCI 202, multiple switching ASICs 204, a first ASIC 206, such as blue field (BF) ASIC, and a second ASIC 208, such as board manager (BM) ASIC. The first ASIC 206 and the second ASIC 208 may coordinate with each other as both the first ASIC 206 and the second ASIC 208 may write to the same register at any time.

The emulation system may further include one or more SPI clients 210 associated with the multiple switching ASICs 204. The one or more SPI clients 210 may support programmable address and data widths. In one non-limiting example, each SPI client 210 may support the programmable address and data widths from 8 to 64 bits respectively. The emulation system may include a SPI master 212 associated with the second ASIC 208. The SPI master 212 may support programmable address and data widths. In one non-limiting example, the SPI master 212 may support the programmable address and data widths from 8 to 64 bits respectively. The emulation system may further include a peripheral component interconnect express (PCIe) 214 associated with the first ASIC 206.

A function of the SCI 202 is to provide the first ASIC 206 and the second ASIC 208 access to the multiple switching ASICs 204 via their corresponding SPIs. The PCIe may have a faster speed and may receive burst access requests from the first ASIC 206, and accordingly the SCI 202 may implement a flow control protocol to prevent the SPIs associated with the multiple switching ASICs 204 from being overrun by the PCIe 214.

The SPI master 212 may determine one or more communication parameters. The SPI master 212 may access and program one or more hardware registers associated with the one or more SPI clients 210 with the one or more communication parameters. In some instances, the one or more SPI clients 210 may receive the one or more communication parameters from the SPI master 212, and the one or more SPI clients 210 may configure the one or more hardware registers with the one or more communication parameters. The one or more communication parameters may include a predetermined time interval associated with periodic pinging operation executed by the SPI master 212. The one or more communication parameters may further include a programmable wait time associated with receiving a response from the one or more SPI clients 210. The one or more communication parameters may further include a programmable time with respect to a whole transaction framing associated with transmission of a response from the one or more SPI clients 210. The one or more communication parameters may further include address bus width and data bus width associated with memory within the one or more SPI clients 210. The one or more communication parameters may further include a predetermined sampling rate associated with the one or more SPI clients 210 to ensure reliable data capture. The one or more communication parameters may further include a transmission start time associated with the one or more SPI clients 210. The one or more communication parameters may further include a data output delay time associated with the one or more SPI clients 210 to ensure reliable data capture.

The SPI master 212 may send read and write transaction requests to the one or more SPI clients 210. For each such transaction request, the SPI master 212 may receive an acknowledgment message from the one or more SPI clients 210 based on the one or more communication parameters. The SPI master 212 may periodically ping the one or more SPI clients 210 based on the one or more communication parameters until the SPI master 212 may receive the acknowledgment message from the one or more SPI clients 210. The acknowledgment message may include a first response (transaction successfully completed), a second response (transaction is pending), a third response (read/write protocol error such as issuing a read request while a write request is pending and vice versa), or a fourth response (invalid acknowledgment codes).

Figure 3:
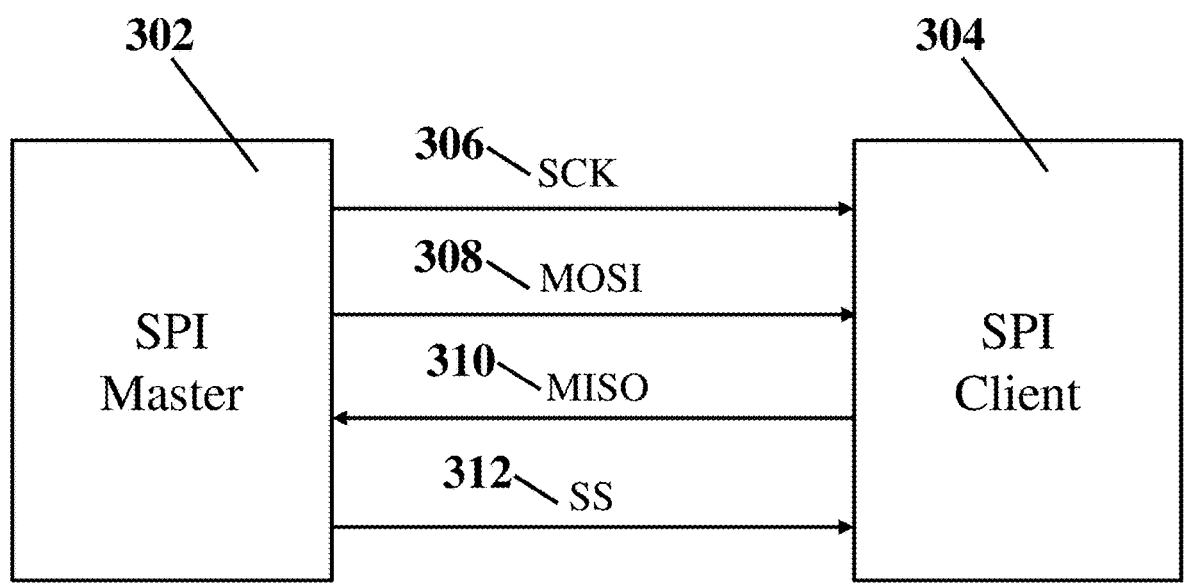
FIG. 3 shows a functional block diagram of a single SPI master-single SPI client communication protocol of an emulation system, according to an embodiment.

FIG. 3 shows a functional block diagram 300 of a single SPI master-single SPI client communication protocol of an emulation system. The emulation system may include a master device (for example, an emulation ASIC or any other device) and a client device (for example, a switching ASIC or any other device). The master device and the client device may communicate with each other by means of their respective SPIs, which may be synchronous serial interfaces. SPI apparatus of the master device may include a clock generator and hardware registers. SPI apparatus of the client device may include hardware registers. Both the master device and the client device may have a data path for entering data to be transmitted into and retrieving received data from their respective hardware registers. The data may be shifted until the content of the hardware registers have been exchanged. Each device may take the data from its hardware register for processing, such as storage into memory. This process may repeat as necessary to transmit any desired data, message, or instruction.

The single SPI master-single SPI client communication protocol may provide synchronous communication between the master device and the client device using separate lines for data and clock, which may keep both the data lines and the clock in perfect synchronization. As shown in the FIG. 3, a SPI master 302 for the master device may interact and communicate with a SPI client 304 for the client device. The SPI client 304 may also be referred as SPI slave. The SPI master 302 may have a plurality of pins. The plurality of pins may include a clock signal (SCK) pin, a Master Out Slave In (MOSI) pin, a Master In Slave Out (MISO) pin, and a Slave Select (SS) pin. Conductive lines may be coupled to each of the plurality of pins of the SPI master 302, and may include branches that may extend to a plurality of pins of the SPI client 304. The plurality of pins of the SPI client 304 may include a SCK pin, a MOSI pin, a MISO pin, and a SS pin. The SPI master 302 may be connected to the SPI client 304 using SCK 306, MOSI 308, MISO 310, and SS 312 lines connecting their respective plurality of pins. The SCK 306, MOSI 308, and MISO 310 logic signals may be shared by multiple SPI clients while each SPI client may have a unique SS 312.

SCK 306 may be a serial clock. The SCK 306 may be an oscillating signal, which may control the entire emulation system. The SCK 306 may include one or more timing pulses each having a rising edge and a falling edge. The SPI master 302 may generate the SCK 306. The SPI master 302 may control the SCK 306. The SPI master 302 may send the SCK 306 to the SPI client 304, which may receive the SCK 306.

The SCK 306 may synchronize data transmission generated by the SPI master 302. For instance, all SPI signals that may be communicated between the SPI master 302 and the SPI client 304 may be synchronous with respect to the SCK 306. The SPI client 304 may use the SCK 306 to determine when to sample one or more bits on a data line. In one instance, a rising (low to high) edge of the SCK 306 may indicate the SPI client 304 to sample the one or more bits on the data line. In another instance, a falling (high to low) edge of the SCK 306 may indicate the SPI client 304 to sample the one or more bits on the data line. When the SPI client 304 may detect the rising or the falling edge of the SCK 306, the SPI client 304 may instantaneously view the data line to read a next bit.

MOSI 308 line may be a data line from the SPI master 302 to the SPI client 304. The MOSI 308 line may be used to transmit data (for example, first data) from the SPI master 302 to the SPI client 304. The SPI client 304 may receive the first data from the SPI master 302 via the MOSI 308 line. The first data may include a message. The MOSI 308 line may toggle on one SCK 306 edge and may be sampled at SCK 306 opposite edge.

MISO 310 line may be a data line from the SPI client 304 to the SPI master 302. The MISO 310 line may be used to transmit data (for example, second data) by the SPI client 304 to the SPI master 302. The SPI client 304 may send the second data to the SPI master 302 in response to the first data received from the SPI master 302. The SPI master 302 may receive the second data from the SPI client 304 via the MISO 310 line. The second data may include an acknowledgement message corresponding to a status of the received message. Since the SPI master 302 generates the SCK 306 and controls the SPI client 304, the SPI master 302 may determine in advance when the SPI client 304 may need to return any data (for example, the acknowledgement message) via the MISO 310 line and how much data will be returned. The MISO 310 line may toggle on one SCK 306 edge and may be sampled at SCK 306 opposite edge.

The MISO 310 line may be connected to the SPI master 302 such that both the master and client devices are reasonably connected to each other. The SPI client 304 may include MISO output delay adjustment circuits, which may be configured to meet the SPI master 302 setup and hold time requirements at its MISO 310 line input.

SS 312 line may be controlled by the SPI master 302. The SPI master 302 may use the SS 312 line to select the SPI client 304 among multiple SPI clients when the SPI master 302 may want to communicate with the SPI client 304 to send and/or receive data (for example, messages). The SPI master 302 may use the SS 312 line to notify the SPI client 304 to wake up for receiving and/or sending the data. The SS 312 line may usually be held high, which may disconnect the SPI client 304 from the SPI master 302. When the data has to be sent to the SPI client 304, the SPI master 302 may bring the SS 312 line to low, which may activate the SPI client 304. When the SPI master 302 has finished communicating with the SPI client 304, the SPI master 302 may make the SS 312 line high again.

In operation, when the SPI master 302 may want to communicate with the SPI client 304, the SPI master 302 may use the SS 312 line to select the SPI client 304. A data transfer cycle may start with assertion of the SS 312 line and may end with de-assertion of the SS 312 line.

The SPI master 302 may transmit a training instruction to the SPI client 304. The training instruction may be a specially configured training instruction. The SPI client 304 may receive the training instruction, and in response may send an instruction having a special fixed data pattern (for example, 64-bit data pattern) to the SPI master 302. When the SPI master 302 may receive the instruction having the special fixed data pattern, the SPI master 302 may determine that the SPI client 304 is active. The SPI master 302 may also use attributes associated with information within the training instruction and the response instruction to adjust the SPI master 302 read capture time setting and/or the SPI client 304 output data delay time setting.

The SPI master 302 may configure or program the SPI client 304. The SPI client 304 may include or is associated with multiple hardware registers. In one non-limiting example, the SPI client 304 may be associated with multiple 64-bit registers that can be accessed by the SPI master 302. The SPI master 302 may access the hardware registers associated with the SPI client 304 using read and write access instructions. The SPI master 302 may pre-configure the hardware registers associated with the SPI client 304 with communication parameters. The SPI master 302 may select the communication parameters. The communication parameters may include a predetermined time interval. The communication parameters may further include address bus widths (for example, 8 bytes). The communication parameters may further include data bus widths (for example, 8 bytes). The communication parameters may further include a programmable wait time.

The SPI master 302 may generate and maintain a record of a latest configuration of the SPI client 304 in which the hardware registers associated with the SPI client 304 may store these communication parameters. The SPI master 302 may use information within the record to format every data transfer the SPI master 302 may initiate with the SPI client 304.

The SPI master 302 may implement SCK 306 cycles. The SPI master 302 may wait for a predetermined waiting period before implementing the SCK 306 cycles. The SPI master 302 may transmit the message to the SPI client 304 during the SCK 306 cycle. The SPI master 302 may send the message on the MOSI 308 line, and the SPI client 304 may receive the message via the MOSI 308 line. The SPI master 302 may not transmit any message to the SPI client 304 until the SPI master 302 may have received a status of a previous message sent to the SPI client 304 from the SPI client 304. The status may include an acknowledgment that current access have been completed.

The message sent by the SPI master 302 to the SPI client 304 may be synchronous to the SCK 306. The message may include one or more instructions. Each instruction may be one byte instruction. The one or more instructions may include read data instructions. The one or more instructions may include write data instructions. In one non-limiting example, the message may be a one byte instruction, followed by address, data, cyclic redundancy check (CRC) byte, or none. The message transfer to the SPI client 304 may end with one byte acknowledgement message followed by read data, CRC byte, or none from the SPI client 304.

When the SPI master 302 may transmit the message to the SPI client 304 for a first time, the SPI master 302 may include an address of the SPI client 304 along with the one or more instructions within the message. Afterwards, when the SPI master 302 may transmit a same type of message to the SPI client 304, the SPI master 302 may not include the address of the SPI client 304 along with the instructions within a new message, and thereby support auto-increment addressing for consecutive read and write instructions.

The SPI master 302 may wait for a specific amount of time for receiving the acknowledgement message from the SPI client 304, in response to the message. The SPI master 302 may preselect the specific amount of time. In some embodiments, the SPI master 302 may program the specific amount of time within the hardware registers associated with the SPI client 304. When the SPI master 302 does not receive the acknowledgement message from the SPI client 304 within the specific amount of time, the SPI master 302 may periodically ping the SPI client 304 at the predetermined time intervals based on one or more polling instructions. The one or more polling instructions may be associated with a pinging operation, which may be automatically performed at a hardware level of the SPI master 302. The predetermined time intervals may be associated with the SPI client 304. For instance, the SPI client 304 may be associated with the hardware registers, which may be pre-configured by the SPI master 302 with the communication parameters, such as the predetermined time intervals for the pinging operation.

The SPI master 302 may ping the SPI client 304 at the predetermined time intervals until the SPI master 302 may receive the acknowledgement message from the SPI client 304. When the SPI master 302 does not receive the acknowledgement message after a threshold number of pinging operations, the SPI master 302 may generate an indication of a time-out error. For example, when the threshold number of pinging operations is equal to five and the SPI master 302 does not receive the acknowledgement message after five pinging operations, the SPI master 302 may generate the time-out error and stop further pinging operations.

The SPI client 304 may receive ping notifications from the SPI master 302. The SPI client 304 may send the acknowledgement message, in response to the message on the MISO 310 line after the programmable wait time, and the SPI master 302 may receive the acknowledgement message via the MISO 310 line. The acknowledgement message may be synchronous to the SCK 306. The acknowledgement message may include a variety of status based on the processing of the message, such as read data completion indication, write data completion indication, read data pending indication, and write data pending indication. The acknowledgement message may further include a protocol error, which may indicate receiving a new read/write message request while a previous message request is still pending. Subsequent to the acknowledgement message, if applicable, the SPI client 304 may send read data on the MISO 310 line and the SPI master 302 may receive the read data via the MISO 310 line.

During the communication and transactions between the SPI master 302 and the SPI client 304, the SPI master 302 and the SPI client 304 may perform CRC check to detect any errors within the data and the messages being shared. To maintain a bandwidth efficiency, CRC checksums may not be exchanged for every transfer between the SPI master 302 and the SPI client 304. In one non-limiting example, both the SPI master 302 and the SPI client 304 may constantly update two CRC checksums. One CRC checksum is for data received (stored in a receive register) and the other CRC checksum is for transmitted data (stored in a transmit register). The SPI master 302 may reset CRC locally together with the SPI client 304 via a CRC reset instruction in order to sync up both the SPI master 302 and the SPI client 304 at any time.

To perform the CRC check, the SPI master 302 may send a CRC check transaction message followed by its receive register value to the SPI client 304. After the programmable wait time, the SPI client 304 may send the acknowledgement message followed by its receive register value to the SPI master 302. During this transaction, the SPI master 302 and the SPI client 304 may exchange their receive register values until the end of a previous transfer. At the end of this transaction, the SPI master 302 and/or the SPI client 304 may determine a CRC error when their transmit register value (a saved copy from a previous transfer) is different from the peer's received register value. When there is the CRC error, the SPI client 304 may set a bit in the acknowledgement message and log the CRC error via the bit, which the SPI master 302 may write '1' to clear.

The SPI client 304 may check the data and the messages received and transmitted. In one instance, the SPI client 304 may perform parity check for the message received from the SPI master 302. The parity check may be a technique, which may ensure accurate data transmission between different electronic devices during electronic communication. In another instance, the SPI client 304 may execute a parity generating technique for the acknowledgement message, which is transmitted to the SPI master 302. The parity generating technique may be an error detection technique for the data transmission. When detecting a parity error within the message, the SPI client 304 may log an error event in a bit within the message, ignore the message if a parity bit in a hardware register is set, or otherwise complete the transfer by sending the acknowledgement message to the SPI master 302 in response to the received message.

The SPI master 302 may send an exact number of SCK 306 clocks while keeping SS 312 line=0, i.e., asserted during a transfer. The SPI client 304 may determine the exact number of the SCK 306 clocks it expects to view during the transfer. When the SS 312 line may be de-asserted before completing the transfer, a transfer cycle short error (SE) may be generated. Upon the SE, the SPI client 304 may abort current transfer handling and log the SE event. When the SS 312 line may be de-asserted after expected number of the SCK 306 clocks are received, a transfer cycle long error (LE) may be generated. Upon the LE, the SPI client 304 may complete current transfer handling as long as there is no instruction error or parity error. The SPI client 304 may log the LE event.

Figure 4:
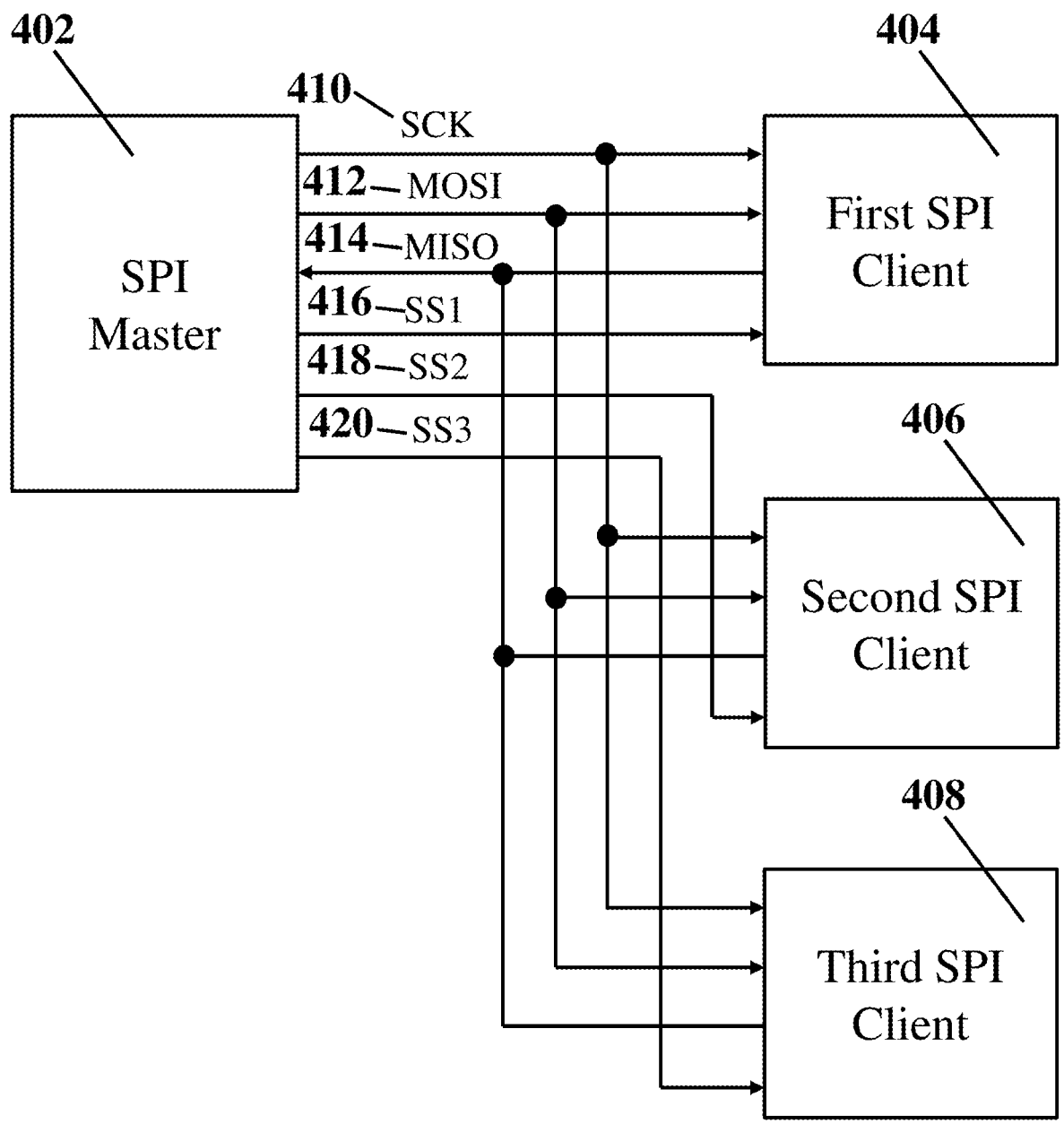
FIG. 4 shows a functional block diagram of a single SPI master-multiple SPI clients communication protocol of an emulation system, according to an embodiment.

FIG. 4 shows a functional block diagram 400 of a single SPI master-multiple SPI clients communication protocol of an emulation system. The emulation system may include a master device (for example, an emulation ASIC, FGPA, an emulation processor, or any other device) and a plurality of client devices (for example, a switching ASIC, FGPA, an emulation processor, or any other device). The master device and the plurality of client devices may communicate with each other by means of their respective SPIs, which may be synchronous serial communication interfaces. SPI apparatus of the master device may include a clock generator and hardware registers. SPI apparatus of each client device may include hardware registers. The master device and each client device may have a data path for entering data to be transmitted into and retrieving received data from their respective hardware registers.

The single SPI master-multiple SPI clients communication protocol may provide synchronous communication between SPI master device and each SPI client device within a plurality of SPI client devices using separate lines for data and clock, which may keep both the data lines and the clock synchronized. As shown in the FIG. 4, a single SPI master 402 for the master device may interact and communicate with a plurality of SPI clients for the plurality of client devices. The SPI master 402 may interact and communicate with only one of the plurality of SPI clients at a time. The plurality of SPI clients may include a first SPI client 404 for a first client device. The first SPI client 404 may also be referred as a first SPI slave. The plurality of SPI clients may further include a second SPI client 406 for a second client device. The second SPI client 406 may also be referred as a second SPI slave. The plurality of SPI clients may further include a third SPI client 408 for a third client device. The third SPI client 406 may also be referred as a third SPI slave. It should be understood that three SPI clients described herein are merely illustrative and additional SPI clients should also be considered to be within the scope of this disclosure. Furthermore, a fewer number of the SPI clients should also be considered to be within the scope of this disclosure.

The SPI master 402 may be connected to the first SPI client 404, the second SPI client 406, and the third SPI client 408 using a SCK 410, a MOSI 412, a MISO 414, and multiple SS lines. The SCK 410, MOSI 412, and MISO 414 logic signals may be shared by the first SPI client 404, the second SPI client 406, and the third SPI client 408 while each of the first SPI client 404, the second SPI client 406, and the third SPI client 408 may have a unique SS line.

The SPI master 402 may have an independent SS line for each SPI client with which the SPI master 402 communicates. For instance, the SPI master 402 may be connected to the first SPI client 404 using SS1 416 line. The SPI master 402 may be connected to the second SPI client 406 using SS2 418 line. The SPI master 402 may be connected to the third SPI client 408 using SS3 420 line. The SPI master 402 may assert only one SS line at a time. Accordingly, although each independent SPI client is coupled in parallel with the SCK 410, the MOSI 412, and the MISO 414 lines of the SPI master 402, but only the SPI client receiving the SS signal will drive its MISO 414 pin. Other unselected SPI clients will simply ignore or disregard the SCK 410 and the MOSI 412 signals.

The SPI master 402 may write data to or request data from the first SPI client 404, the second SPI client 406, or the third SPI client 408 that may share common data lines, such as SCK 410, MOSI 412, and MISO 414, by enabling a particular SPI client from a group of the first SPI client 404, the second SPI client 406, and the third SPI client 408, by setting the SS line of the corresponding SPI client to logic low. In one embodiment, the SPI master 402 may enable the first SPI client 404, the second SPI client 406, and the third SPI client 408 simultaneously. In another embodiment, the SPI master 402 may not enable the first SPI client 404, the second SPI client 406, and the third SPI client 408 simultaneously as the data returned to the SPI master 402 may be corrupted. In this embodiment, the SPI master 402 may enable only one SPI client at a time from the first SPI client 404, the second SPI client 406, and the third SPI client 408.

SCK 410 may be a serial clock. The SCK 410 may be an oscillating signal, which may control the entire emulation system. A new data bit may be shifted out with each clock cycle. The SPI master 402 may generate the SCK 410. The SPI master 402 may control the SCK 410. The SPI master 402 may send the SCK 410 to the first SPI client 404, the second SPI client 406, and the third SPI client 408, which may receive the SCK 410.

The SCK 410 may synchronize data transmission generated by the SPI master 402. For instance, all SPI signals communicated between the SPI master 402 and each of the plurality of SPI clients (such as the first SPI client 404, the second SPI client 406, and the third SPI client 408) may be synchronous with respect to the SCK 410. The first SPI client 404, the second SPI client 406, and/or the third SPI client 408 may use the SCK 410 to determine when to sample one or more bits on a data line. In one instance, a rising (low to high) edge of the SCK 410 may indicate the first SPI client 404, the second SPI client 406, and/or the third SPI client 408 to sample the one or more bits on the data line. In another instance, a falling (high to low) edge of the SCK 410 may indicate the first SPI client 404, the second SPI client 406, and/or the third SPI client 408 to sample the one or more bits on the data line. When the first SPI client 404, the second SPI client 406, and/or the third SPI client 408 may detect the rising or the falling edge of the SCK 410, the first SPI client 404, the second SPI client 406, and/or the third SPI client 408 may instantaneously view the data line to read a next bit.

MOSI 412 line may be a data line from the SPI master 402 to the first SPI client 404, the second SPI client 406, and the third SPI client 408. The MOSI 412 line may be used to transmit data (for example, first data) from the SPI master 402 to a selected SPI client within a group of the first SPI client 404, the second SPI client 406, and the third SPI client 408. The first SPI client 404, the second SPI client 406, and/or the third SPI client 408 may receive the first data from the SPI master 402 via the MOSI 412 line. The first data may include a message. The MOSI 412 line may toggle on one SCK 410 edge and may be sampled at SCK 410 opposite edge.

MISO 414 line may be a data line from the first SPI client 404, the second SPI client 406, and the third SPI client 408 to the SPI master 402. The MISO 414 line may be used to transmit data (for example, second data) by the first SPI client 404, the second SPI client 406, and/or the third SPI client 408 to the SPI master 402. The first SPI client 404, the second SPI client 406, and/or the third SPI client 408 may send the second data to the SPI master 402, in response to the first data received from the SPI master 402. The SPI master 402 may receive the second data from the first SPI client 404, the second SPI client 406, and/or the third SPI client 408 via the MISO 414 line. The second data may include an acknowledgement message. Since the SPI master 402 may generate the SCK 410 and control each of the plurality of SPI clients, the SPI master 402 may determine in advance when the first SPI client 404, the second SPI client 406, and/or the third SPI client 408 may need to return any data (for example, the acknowledgement message) via the MISO 414 line and how much data will be returned. The MISO 414 line may toggle on one SCK 410 edge and may be sampled at SCK 410 opposite edge.

The MISO 414 line may be connected to the SPI master 402 such that both the master and plurality of client devices are practically connected to each other. Each of the plurality of SPI clients may include MISO output delay adjustment circuits, which may be configured to meet the SPI master 402 setup and hold time requirements at its MISO 414 line input.

SS lines, such as SS1 416 line, SS2 418 line, and SS3 420 line may be controlled by the SPI master 402. The SPI master 402 may use the SS1 416 line, the SS2 418 line, or the SS3 420 line to select the first SPI client 404, the second SPI client 406, or the third SPI client 408 that the SPI master 402 may want to communicate with to send and/or receive data.

The SPI master 402 may use the SS1 416 line to select the first SPI client 404. The SPI master 402 may use the SS1 416 line to notify the first SPI client 404 to wake up for receiving and/or sending data. The SS1 416 line may usually be held high, which may disconnect the first SPI client 404 from the SPI master 402. When the data has to be sent to the first SPI client 404, the SPI master 402 may bring the SS1 416 line to low, which may activate the first SPI client 404. When the SPI master 402 has finished communicating with the first SPI client 404, the SPI master 402 may make the SS1 416 line high again.

The SPI master 402 may use the SS2 418 line to select the second SPI client 406. The SPI master 402 may use the SS2 418 line to notify the second SPI client 406 to wake up for receiving and/or sending data. The SS2 418 line may usually be held high, which may disconnect the second SPI client 406 from the SPI master 402. When the data has to be sent to the second SPI client 406, the SPI master 402 may bring the SS2 418 line to low, which may activate the second SPI client 406. When the SPI master 402 has finished communicating with the second SPI client 406, the SPI master 402 may make the SS2 418 line high again.

The SPI master 402 may use the SS3 420 line to select the third SPI client 408. The SPI master 402 may use the SS3 420 line to notify the third SPI client 408 to wake up for receiving and/or sending data. The SS3 420 line may usually be held high, which may disconnect the third SPI client 408 from the SPI master 402. When the data has to be sent to the third SPI client 408, the SPI master 402 may bring the SS3 420 line to low, which may activate the third SPI client 408. When the SPI master 402 has finished communicating with the third SPI client 408, the SPI master 402 may make the SS3 420 line high again.

In operation, when the SPI master 402 may want to communicate with the first SPI client 404, the SPI master 402 may use the SS1 416 line to select the first SPI client 404. Afterwards, an input timing check may be performed where the SCK 410, MOSI 412 line, and SS1 416 line from the SPI master 402 may have their board traces routed such that pad-to-pad (or at least pin-to-pin between the master device and the first client device) delays are closely matched. In one configuration, the SPI master 402 may update its output data (for example, a message) on the MOSI 412 line on a falling edge of the SCK 410. The first SPI client 404 may latch the data on a rising edge of the SCK 410, i.e., right in a middle of a data window, which gives it half SCK 410 period setup and hold times when there may be a predetermined percentage (for example, 50%) of duty cycle for the SCK 410. When the SCK 410 may have the duty cycle distortion, there may be a shift in the SCK 410 period. In some cases, the SPI master 402 may have output delay skew between the SCK 410 and the MOSI 412 line, which may range from close to 0 to a few nanoseconds. As a result of these distortions and other factors, a sample pulse may be placed outside of the data window, and the SPI master 402 writes may then work upon further adjustment of a sampling pulse position via an input delay control.

The SPI master 402 may generate and transmit a first predetermined training instruction to the first SPI client 404. The first SPI client 404 may receive the first predetermined training instruction, and in response may send a second predetermined training instruction to SPI master 402. The SPI master 402 may receive and process the second predetermined training instruction. The SPI master 402 may determine characteristics associated with the second predetermined training instruction, such as MISO 414 line output data delay time setting default values. The SPI master 402 may capture a predetermined number of bits from the second predetermined training instruction. The SPI master 402 may determine whether data received within the second predetermined training instruction matches a predetermined pattern. When the data received within the second predetermined training instruction does not match the predetermined pattern, the SPI master 402 may mark said output data delay time setting default values as invalid. When the data received within the second predetermined training instruction matches the predetermined pattern, the SPI master 402 may mark said output data delay time setting default values as valid.

The SPI master 402 may increment said output data delay time setting default values by one, and then repeat the steps discussed above (for example, the input timing check and the execution of the first predetermined training instruction) based on these new output data delay time setting default values until a predetermined combinations of the output data delay time setting default values are checked. The SPI master 402 may determine and process a collection of all valid output data delay time setting default values, and then select a valid output data delay time setting, which may place the MISO data window centered at a sampling edge of the SCK 410. The SPI master 402 may store selected valid output data delay time setting in hardware registers associated with the first SPI client 404. Based on this selected output data delay time setting, in subsequent operations, the first SPI client 404 may start its data transmission on the MISO 414 line early enough before a first sampling edge of the SCK 410 at the SPI master 402 so that the SPI master 402 may reliably capture a first bit of the data from the first SPI client 404.

The SPI master 402 may configure the SCK 410. The SPI master 402 may use a frequency supported by the first SPI client 404 to configure the SCK 410. The SPI master 402 may configure a clock rate of the SCK 410 in view of the frequency supported by the first SPI client 404. Depending on the clock rate of the SCK 410, input timing parameters associated with the SPI master 402, and emulation board design, an output data delay time setting of the first SPI client 404 may be adjusted via a hardware register associated with the first SPI client 404.

The SPI master 402 may set up the first SPI client 404. The first SPI client 404 may be associated with multiple hardware registers. The hardware registers may include programming state data. The SPI master 402 may access and set up the hardware registers associated with the first SPI client 404 with multiple communication parameters. The SPI master 402 may select the communication parameters, which may be used to set up the hardware registers associated with the first SPI client 404. The communication parameters may include predetermined time intervals, a programmable wait time associated with receiving a response from the first SPI client 404, an address bus width associated with memory space within the first SPI client 404, a data bus width associated with memory space within the first SPI client 404, a predetermined sampling rate at the first SPI client 404, a predetermined or programmable transmission time corresponding to the first SPI client 404 transmission start time of its response frame, and a predetermined delay corresponding to the first SPI client 404 data output delay. The SPI master 402 may generate and maintain a record of a latest configuration of the first SPI client 404 in which the hardware registers associated with the first SPI client 404 may store these communication parameters.

When the hardware registers associated with the first SPI client 404 are configured with the multiple communication parameters, the first SPI client 404 may execute subsequent operations based on information within the communication parameters. For instance, based on the communication parameter such as the predetermined sampling rate, the first SPI client 404 may perform oversampling during the subsequent operations. Accordingly, during the subsequent operations, the first SPI client 404 may use its internal clock for input oversampling. The internal clock of the first SPI client 404 may be faster than the SCK 410. In another instance, based on the communication parameter such as the predetermined transmission time, the first SPI client 404 may have to send its response data at a given position during the subsequent operations. Accordingly, during the subsequent operations, the first SPI client 404 may send its response data at a given position with respect to a transaction frame. In yet another instance, based on the communication parameter such as the predetermined delay, during the subsequent operations, the first SPI client 404 may delay its response data based on an internal clock of the first SPI client 404.

The SPI master 402 may implement SCK 410 cycles. The SPI master 402 may wait for a predetermined waiting period before implementing the SCK 410 cycles. The SPI master 402 may transmit a message to the first SPI client 404 during the SCK 410 cycle. The SPI master 402 may send the message on the MOSI 412 line, and the first SPI client 404 may receive the message via the MOSI 412 line. The message may be synchronous to the SCK 410. The message may include one or more instructions. The one or more instructions may be unique instructions, which are different from each other. Each instruction may be one byte instruction. The one or more instructions may include read data instructions. The one or more instructions may include write data instructions.

The SPI master 402 may expect to receive an acknowledgement message from the first SPI client 404, in response to the message based on the communication parameters. For instance, the SPI master 402 may expect to receive the acknowledgement message from the first SPI client 404 based on the predetermined sampling rate executed by the first SPI client 404. The first SPI client 404 may use its internal clock for oversampling in order to achieve the predetermined sampling rate. The SPI master 402 may also expect to receive the acknowledgement message from the first SPI client 404 after the programmable wait time. The acknowledgement message may be one byte message.

The SPI master 402 may periodically ping the first SPI client 404 at the predetermined time intervals based on one or more polling instructions. The one or more polling instructions may be associated with a pinging operation, which may be automatically performed at a hardware level of the SPI master 402. The predetermined time intervals may be associated with the first SPI client 404. For instance, the first SPI client 404 may include the hardware registers, which may be pre-configured by the SPI master 402 with the communication parameters, such as the predetermined time intervals for the pinging operation.

The SPI master 402 may ping the first SPI client 404 at the predetermined time intervals until the SPI master 402 may receive the acknowledgement message from the first SPI client 404. When the SPI master 402 does not receive the acknowledgement message after a threshold number of pinging operations, the SPI master 402 may generate an indication of a time-out error. For example, when the threshold number of pinging operations is equal to five and the SPI master 402 does not receive the acknowledgement message from the first SPI client 404 after five pinging operations, the SPI master 402 may generate the time-out error and stop further pinging operations.

The first SPI client 404 may receive ping notifications from the SPI master 402. The first SPI client 404 may generate and send the acknowledgement message based on the predetermined sampling rate, the predetermined response delay, and other communication parameters, in response to the message, on the MISO 414 line. The SPI master 402 may receive the acknowledgement message via the MISO 414 line.

The acknowledgement message may include a variety of status based on the processing of the message, such as read data completion indication, write data completion indication, read data pending indication, and write data pending indication. The acknowledgement message may further include a protocol error, which may indicate receiving a new read/write message request while a previous message request is still pending. Subsequent to the acknowledgement message, if applicable, the first SPI client 404 may send read data on the MISO 414 line and the SPI master 402 may receive this data via the MISO 414 line.

When the SPI master 402 may want to communicate with the second SPI client 406, the SPI master 402 may use the SS2 418 line to select the second SPI client 406. The SPI master 402 may set up hardware registers associated with the second SPI client 406 with multiple communication parameters. The communication parameters may include predetermined time intervals, a programmable wait time associated with receiving a response from the second SPI client 406, an address bus width associated with memory space within the second SPI client 406, a data bus width associated with memory space within the second SPI client 406, a predetermined sampling rate at the second SPI client 406, a predetermined or programmable transmission time corresponding to the second SPI client 406 transmission start time of its response frame, and a predetermined delay corresponding to the second SPI client 406 data output delay.

The SPI master 402 may transmit a message to the second SPI client 406. The SPI master 402 may send the message on the MOSI 412 line, and the second SPI client 406 may receive the message via the MOSI 412 line. The message may include read/write data instructions. The SPI master 402 may expect to receive an acknowledgement message from the second SPI client 406, in response to the message, based on the communication parameters. The SPI master 402 may periodically ping the second SPI client 406 at the predetermined time intervals associated with the second SPI client 406. The SPI master 402 may ping the second SPI client 406 at the predetermined time intervals until the SPI master 402 may receive the acknowledgement message from the second SPI client 406. The second SPI client 406 may send the acknowledgement message based on the predetermined sampling rate, the predetermined response delay, and other communication parameters, in response to the message, on the MISO 414 line. The SPI master 402 may receive the acknowledgement message via the MISO 414 line.

When the SPI master 402 may want to communicate with the third SPI client 408, the SPI master 402 may use the SS3 420 line to select the third SPI client 408. The SPI master 402 may set up hardware registers associated with the third SPI client 408 with multiple communication parameters. The communication parameters may include predetermined time intervals, a programmable wait time associated with receiving a response from the third SPI client 408, an address bus width associated with memory space within the third SPI client 408, a data bus width associated with memory space within the third SPI client 408, a predetermined sampling rate at the third SPI client 408, a predetermined or programmable transmission time corresponding to the third SPI client 408 transmission start time of its response frame, and a predetermined delay corresponding to the third SPI client 408 data output delay.

The SPI master 402 may transmit a message to the third SPI client 408. The SPI master 402 may send the message on the MOSI 412 line, and the third SPI client 408 may receive the message via the MOSI 412 line. The message may include read/write data instructions. The SPI master 402 may expect to receive an acknowledgement message from the third SPI client 408, in response to the message, based on the communication parameters. The SPI master 402 may periodically ping the third SPI client 408 at the predetermined time intervals associated with the third SPI client 408. The SPI master 402 may ping the third SPI client 408 at the predetermined time intervals until the SPI master 402 may receive the acknowledgement message from the third SPI client 408. The third SPI client 408 may send the acknowledgement message based on the predetermined sampling rate, the predetermined response delay, and other communication parameters, in response to the message, on the MISO 414 line. The SPI master 402 may receive the acknowledgement message via the MISO 414 line.

Figure 5A:
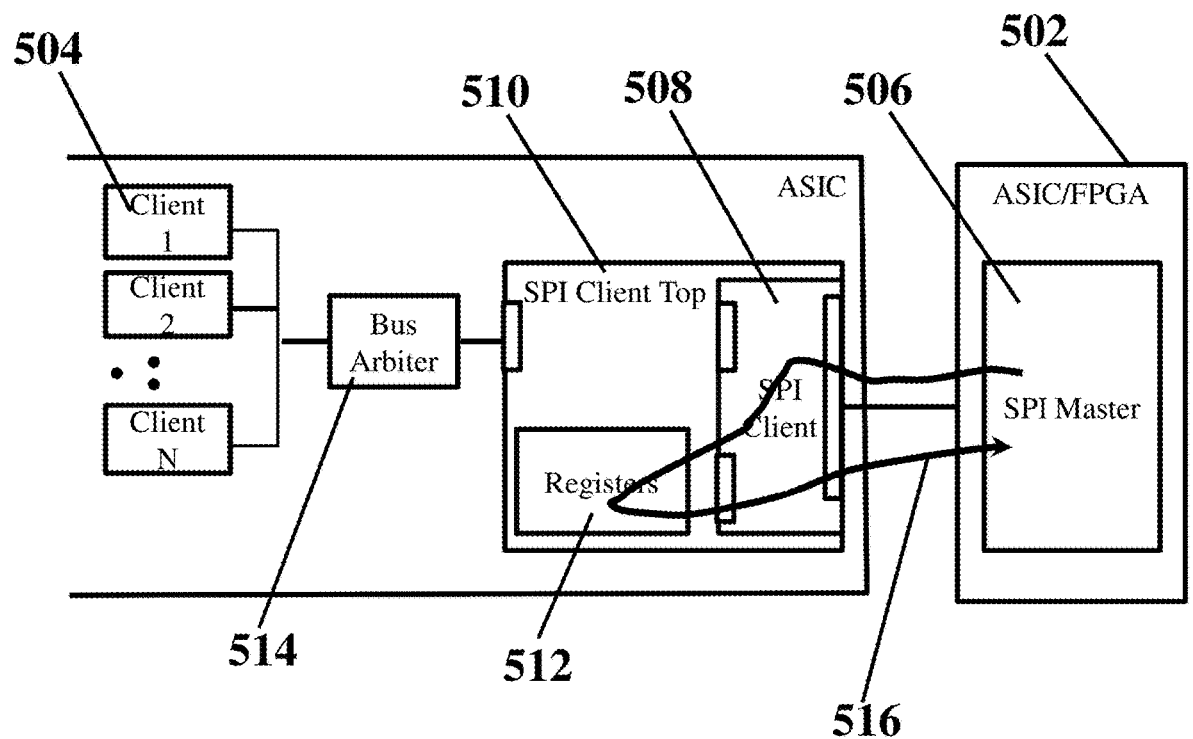
FIG. 5A shows a SPI transaction data path between a SPI master and one or more SPI clients of an emulation system, according to an embodiment.
Figure 5B:
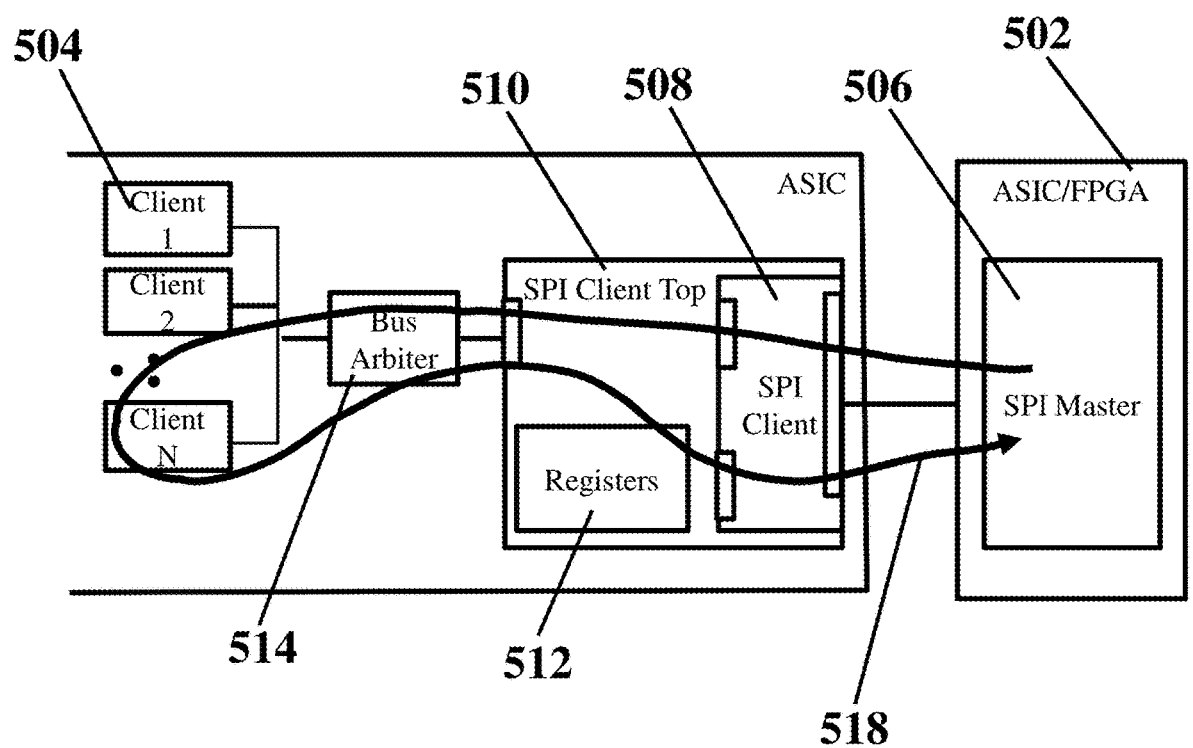
FIG. 5B shows a SPI transaction data path between a SPI master and one or more SPI clients of an emulation system, according to an embodiment.
Figure 5C:
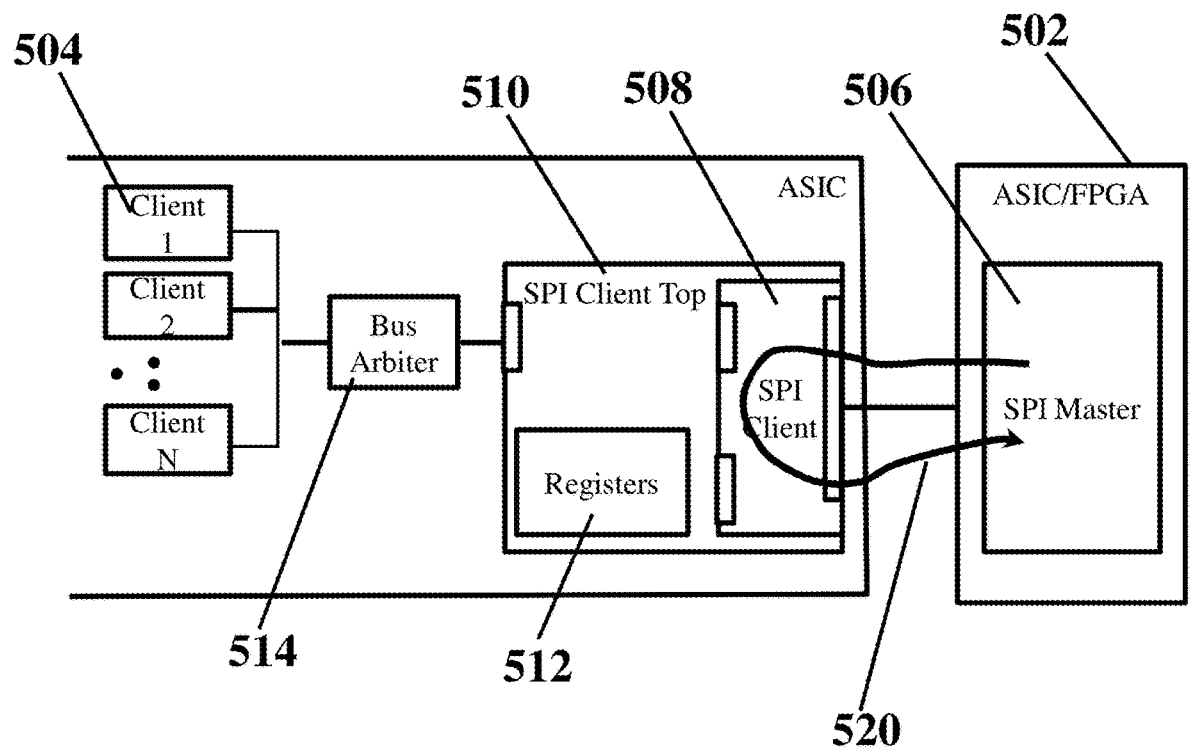
FIG. 5C shows a SPI transaction data path between a SPI master and one or more SPI clients of an emulation system, according to an embodiment.

FIGS. 5A-5C show transmission data paths between at least one master device (for example, ASIC, FGPA, etc.) 502 and at least one client device (for example, FGPA, etc.) 504 of an emulation system. The master device 502 may be associated with a SPI master 506. The client device 504 may be associated with a SPI client 508. The master device 502 may interact and communicate with the client device 504 using the SPI master 506 and the SPI client 508. The SPI client 508 may be associated with a top level module, such as a SPI client top 510. The SPI client 508 may further be associated with hardware registers 512. The client device 504 may further be associated with a bus arbiter 514, which may be configured to handle internal access on behalf of the SPI client 508.

In a first transmission data path 516 shown in the FIG. 5A, the SPI master 506 may transmit a first instruction to the client device 504 via the SPI client 508. The first instruction may be associated with configuration space access corresponding to the hardware registers 512.

The first instruction may be a write access instruction to have write access of the hardware registers 512. The write access instruction may be a 64-bit write request to the hardware registers 512. The SPI master 506 may send the write access instruction followed by data to the SPI client 508. The data may include communication parameters. The SPI client 508 may update the hardware registers 512 based on received data. After a predetermined delay time, the SPI client 508 may send an acknowledgement message to the SPI master 506.

The first instruction may be a read access instruction to have read access of the hardware registers 512. The read access instruction may be a 64-bit read request from the hardware registers 512. The SPI master 506 may send the read access instruction to the SPI client 508. After a predetermined delay time, the SPI client 508 may send an acknowledgement message to the SPI master 506 followed by read data from the hardware registers 512.

In a second transmission data path 518 shown in the FIG. 5B, the SPI master 506 may transmit a second instruction to the client device 504 via the SPI client 508. The second instruction may be associated with memory space access.

The second instruction may be a write status instruction, which is a write status check request corresponding to a last write transfer request that the SPI client 508 responded with a write pending status. Upon receiving the write pending status for the last write transfer request, the SPI master 506 may hold off any new memory read/write requests. The SPI master 506 may ping the SPI client 508 with the write status instruction for a minimum number of times spread over a certain period. The SPI master 506 may declare a write time-out when the SPI master 506 does not receive an acknowledgment message from the SPI master 506 after repeated write status instructions. The SPI client 508 may ignore any new write requests from the SPI master 506 while the previous memory access request is still pending.

The second instruction may be a read status instruction, which is a read status check request corresponding to a last read transfer request that the SPI client 508 responded with a read pending status. Upon receiving the read pending status for the last read transfer request, the SPI master 506 may hold off any new memory read/write requests. The SPI master 506 may ping the SPI client 508 with the read status instruction for a minimum number of times spread over a certain period. The SPI master 506 may declare a read time-out when the SPI master 506 does not receive an acknowledgment message from the SPI master 506 after repeated read status instructions. The SPI client 508 may ignore any new read requests from the SPI master 506 while the previous memory access request is still pending.

In a third transmission data path 520 shown in the FIG. 5C, the SPI master 506 may transmit a third instruction to the SPI client 508. The third instruction may be associated with SPI link check.

The third instruction may be a request for running CRC check at the SPI master 506 and the SPI client 508. The SPI master 506 may send the third instruction followed by its register value to the SPI client 508. After a predetermined delay period, the SPI client 508 may send an acknowledgement message followed by its register value to the SPI master 506. A training processor may evaluate these registers values to determine any CRC error.

The third instruction may be a request for resetting the SPI client 508 CRC. The CRC reset to 0 may require CRC cleared to all zeroes while the CRC reset to 1 may require CRC cleared to all ones instead. The SPI master 506 may send the third instruction to the SPI client 508 to reset the CRC to 0 or 1. After a predetermined delay, the SPI client 508 may send an acknowledgement message to the SPI master 506. The acknowledgement message may be based on whether the CRC was reset to 0 or 1.

The third instruction may be a training instruction. The SPI master 506 may send the training instruction to the SPI client 508. In response, the SPI client 508 may send a known 64-bit data pattern, following an acknowledgment message, after a predetermined delay time to the SPI master 506.

Figure 6:
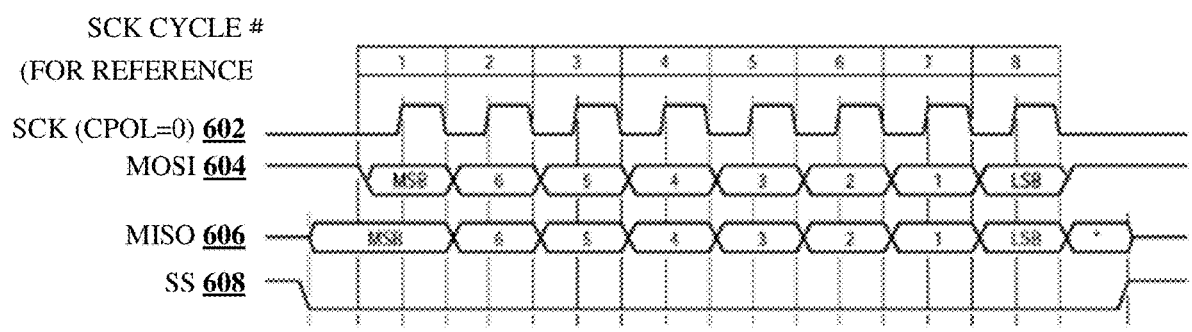
FIG. 6 shows timings of signals between a SPI master and a SPI client based upon a communication protocol, according to an embodiment.

FIG. 6 shows timings of signals between a SPI master for a master device (for example, FGPA, ASIC, etc.) and a SPI client for a client device (for example, FGPA, ASIC, etc.) of an emulation system. The SPI master may be connected to the SPI client using SCK 602, MOSI 604, MISO 606, and SS 608 lines. The SCK 602, MOSI 604, and MISO 606 signals may be shared by one or more SPI clients while each SPI client may have a unique SS 608 line.

The SCK 602 line may be a control line driven by the SPI master to regulate a flow of data bits. The MOSI 604 line may be a communication line, which may supply output data from the SPI master to an input of the SPI client. The MISO 606 line may be a communication line, which may supply output data from the SPI client to an input of the SPI master. The SS 608 line may be a control line, which may allow the SPI client to be turned ON and OFF by the SPI master.

For both the SPI master and the SPI client, output data may be toggled at a falling edge of the SCK 602 and input data may be sampled at a rising edge of the SCK 602. So, in an ideal situation, the input data may have a half cycle of setup time window when there is a 50% SCK 602 duty cycle. In reality, the SCK 602 may have duty cycle distortion. The SCK 602 duty cycle may get changed due to other factors, such as device output delay, propagation delay, device input delay, etc.

When the SCK 602 may have duty cycle distortion, the device's output to pad delays may take an order of a few nanoseconds as a result of their drive strength and output loading. All of these factors may add up and increase a round-trip delay, and thus making a first bit of the SPI client response slip past its sampling edge perceived by the SPI master. In order to mitigate this problem associated with the round-trip delay, a training processor may adjust output delay setting of the SPI client and input delay setting of the SPI master.

The SPI client may provide adjustments of its output delay setting, which may allow time-shift of its response frame start position. For instance, left-shifting (earlier time) the output may counter-act the slipping effects. When the adjustment of the output delay setting of the SPI client is not enough, the SPI master may provide cycle-based adjustment of its input delay setting. During this adjustment process, the training processor may use bit patterns from a training response instruction received from the SPI client during link training, which are "10001101 . . . ". By searching for a first bit (=1) of the response from the SPI client during the link training process, the SPI master may measure its latency relative to expected position from the SPI master timing sequence. By observing this measurement, the training processor may select a delayed sampling position for a first bit from a register, which may provide up to 8 bit clock positions for delayed sampling. Using the adjustment of the output delay setting of the SPI client and the input delay setting of the SPI master, the SPI master may determine an optimal bit position to sample-and-capture the response of the SPI client.

In the example shown in the FIG. 6, a transaction may begin between the SPI master and the SPI client when the SS 608 line may be driven to logic low. A relationship between the SS 608, the SCK 602, and transaction data may depend on how clock polarity (CPOL) and clock phase (CPHA) are configured. The SPI master may configure the CPOL and the CPHA with respect to the data. CPOL may determine a polarity of the SCK 602. CPHA may determine a time (for example, a phase) of data bits relative to the SCK 602 pulses. In this example, the CPOL and the CPHA are specified as '0'. CPOL=0 is the SCK 602 which idles at 0, and each cycle includes a pulse of 1. CPHA=0 cycle consists of a half cycle with the SCK 602 idle, followed by a half cycle with the SCK 602 asserted.

The SCK 602 has eight cycles. Within the SCK 602: (i) 1 may indicate a first cycle of the SCK 602, (ii) 2 may indicate a second cycle of the SCK 602, (iii) 3 may indicate a third cycle of the SCK 602, (iv) 4 may indicate a fourth cycle of the SCK 602, (v) 5 may indicate a fifth cycle of the SCK 602, (vi) 6 may indicate a sixth cycle of the SCK 602, (vii) 7 may indicate a seventh cycle of the SCK 602, and (vii) 8 may indicate a last cycle of the SCK 602. The SPI master may output the data via the MOSI 604 line on a trailing edge of a preceding SCK 602 cycle, while the SPI client may capture the data on a leading edge of the SCK 602 cycle. The SPI master may hold the data valid until the trailing edge of the current SCK 602 cycle.

Figure 7:
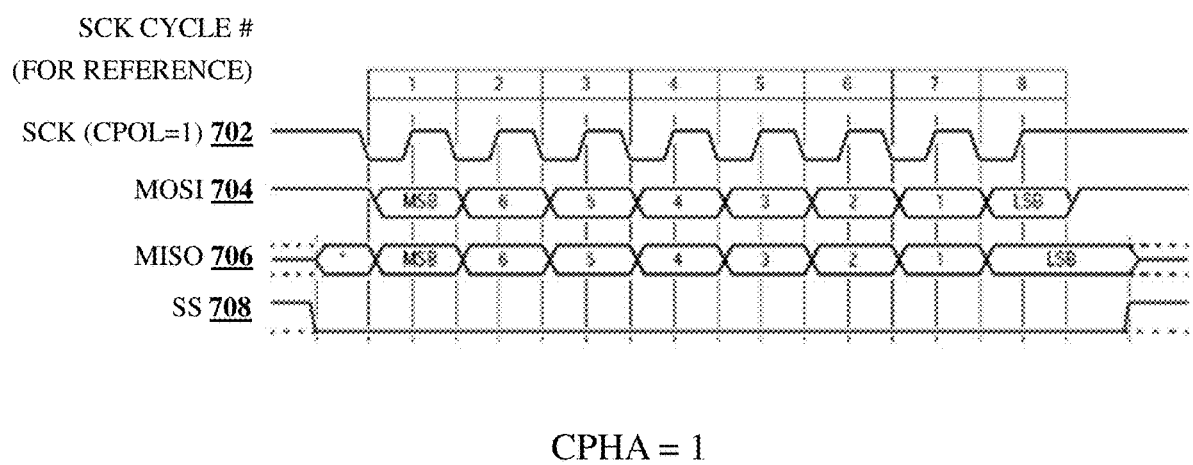
FIG. 7 shows timings of signals between a SPI master and a SPI client based upon a communication protocol, according to an embodiment.

FIG. 7 shows timings of signals between a SPI master for a master device (for example, FGPA, ASIC, etc.) and a SPI client for a client device (for example, FGPA, ASIC, etc.). FIG. 7 will be explained in conjunction with the signals of FIG. 6. The SPI master may be connected to the SPI client using SCK 702, MOSI 704, MISO 706, and SS 708 lines. The SCK 702, MOSI 704, and MISO 706 signals may be shared by one or more SPI clients while each SPI client may have a unique SS 708 line.

The SCK 702 line may be a control line driven by the SPI master to regulate a flow of data bits. The MOSI 704 line may be a communication line, which may supply output data from the SPI master to an input of the SPI client. The MISO 706 line may be a communication line, which may supply output data from the SPI client to an input of the SPI master. The SS 708 line may be a control line, which may allow the SPI client to be turned on and off by the SPI master.

In the example shown in the FIG. 7, a transaction may begin between the SPI master and the SPI client when the SS 708 line may be driven to logic low. In this example, the CPOL and the CPHA are specified as '1. CPOL=1 is the SCK 702 which idles at 1, and each cycle includes a pulse of 0. CPHA=1 cycle consists of a half cycle with the SCK 702 asserted, followed by a half cycle with the SCK 702 idle. The SPI master may output the data via the MOSI 704 line on a leading edge of a current SCK 702 cycle, while the SPI client may capture the data on a trailing edge of the SCK 702 cycle. The SPI master may hold the data valid until the leading edge of the following SCK 702 cycle.

FIG. 8 shows execution steps for communication between SPI enabled devices, according to a method 800. The method 800 may include execution steps 802, 804, 806, and 808. It should be understood that the steps described herein are merely illustrative and additional or substitute steps should also be considered to be within the scope of this disclosure. Furthermore, methods with a fewer numbers of steps should also be considered to be within the scope of this disclosure.

At step 802, a SPI master for a master device (for example, ASIC, FGPA, etc.) may transmit a first message to a first SPI client for a first client device (for example, ASIC, FGPA, etc.). The first message may include one or more first instructions. The one or more first instructions may include read data and/or write data instructions. The SPI master may transmit the first message to the first SPI client through a first data connection between the SPI master and the first SPI client. The first data connection may be a data line for transfer of data from the SPI master to the first SPI client.

Prior to sending the first message, the SPI master may set up the first SPI client. The first SPI client may include or is associated with a first set hardware registers. The first set hardware registers may include a plurality of 64-bit registers. In one non-limiting example, the first SPI client may include eight 64-bit registers. The SPI master may pre-configure the first set of hardware registers with a first set of communication parameters. The first set of communication parameters may include a predetermined time interval, an address bus width, and a data bus width. Once the first set of hardware registers are preconfigured, the SPI master may transmit the first message to the first SPI client.

At step 804, after the SPI master may transmit the first message to the first SPI client, the SPI master may periodically ping the first SPI client through the first data connection. The pinging operation may be automatically performed at a hardware level of the SPI master. The SPI master may periodically ping the first SPI client until the SPI master may receive a first acknowledgement message from the first SPI client, in response to the first message. The SPI master may execute the periodic pinging operation based on the first set of communication parameters, such as the predetermined time interval. For example, when the predetermined time interval is 5 seconds, the SPI master ping the first SPI client after every 5 seconds until the SPI master may receive the first acknowledgement message from the first SPI client.

The first acknowledgement message may be one byte long. The first acknowledgement message may include first read or first write completion indication. The first acknowledgement message may include first read or first write pending indication. The first acknowledgement message may include first read or first write unsuccessful completion indication. The first acknowledgement message may include a protocol error indication, such as receiving a new read/write request while a previous request is still pending.

At step 806, the SPI master may measure a number of pinging operations performed through the first data connection. When the SPI master does not receive the first acknowledgement message after a threshold number of pinging operations, the SPI master may generate an indication of a time-out error. When the SPI master may receive the first acknowledgement message within the threshold number of pinging operations, the SPI master may receive the first acknowledgement message through a receiving data connection, which may be different from the first data connection. The receiving data connection may be a data line for transfer of data from the first SPI client to the SPI master. The first message and the first acknowledgement message may be synchronous to a clock generated by the SPI master.

At step 808, when the SPI master has received the first acknowledgement message, the SPI master may determine a status of a first read or a first write operation associated with the first message at the first SPI client based upon the first acknowledgement message. In some instances, the SPI master may receive first read data after receiving the first acknowledgement message.

FIG. 9 shows execution steps for communication between SPI enabled devices, according to a method 900. The method 900 may include execution steps 902, 904, 906, and 908. It should be understood that the steps described herein are merely illustrative and additional or substitute steps should also be considered to be within the scope of this disclosure. Furthermore, methods with a fewer numbers of steps should also be considered to be within the scope of this disclosure.

At step 902, a first SPI client for a first client device (for example, ASIC, FGPA, etc.) may communicate with a SPI master for a master device (for example, ASIC, FGPA, etc.). The SPI master may select a first set of communication parameters. The SPI master may send the first set of communication parameters to the first SPI client. The first SPI client may receive the first set of communication parameters from the SPI master to configure subsequent communication between the first SPI client and the SPI master.

At step 904, the first SPI client may configure a first set of hardware registers associated with or within the first SPI client based upon the first set of communication parameters. The first set of communication parameters may include a first sampling rate and a first response delay. Upon the configuration of the first set of hardware registers, the first SPI client may execute further operations based at least on the first sampling rate and the first response delay.

At step 906, the first SPI client may receive a first request from the SPI master. The first SPI client may receive the first request through a first data connection between the SPI master and the first SPI client. The first data connection may be a data line for transfer of data from the SPI master to the first SPI client. The first request may include one or more first instructions. The one or more first instructions may include read data and/or write data instructions.

At step 908, the first SPI client may generate and transmit to the SPI master a first response based on the first request. The first SPI client may generate and transmit the first response through another data connection based upon the first sampling rate and the first response delay. The first response may be a first acknowledgement message. When the SPI master may receive the first response, the SPI master may determine a status of a first read or a first write operation associated with the first request at the first SPI client based upon the first response.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of communication between communication interfaces, the method comprising:
    receiving, by a first communication interface client from a communication interface master, a first set of communication parameters to configure subsequent communication between the communication interface master and the first communication interface client;
    configuring, by the first communication interface client, a first set of hardware registers associated with the first communication interface client based upon the received first set of communication parameters, wherein the first set of communication parameters comprises a first sampling rate and a first response delay;
    receiving, by the first communication interface client from the communication interface master, a first request through a first data connection between the communication interface master and the first communication interface client; and
    transmitting, by the first communication interface client to the communication interface master, a first response based on the first request in accordance with the first set of communication parameters.

2. The method of claim 1, further comprising:
    receiving, by a second communication interface client from the communication interface master, a second set of communication parameters to configure subsequent communication between the communication interface master and the second communication interface client;
    configuring, by the second communication interface client, a second set of hardware registers associated with the second communication interface client based upon the received second set of communication parameters, wherein the second set of communication parameters comprises a second sampling rate and a second response delay;
    receiving, by the second communication interface client from the communication interface master, a second request through a second data connection between the communication interface master and the second communication interface client; and transmitting, by the second communication interface client to the communication interface master, a second response based on the second request in accordance with the second set of communication parameters.

3. The method of claim 1, further comprising using, by the first communication interface client, an internal clock for input over-sampling.

4. The method of claim 3, wherein the internal clock of the first communication interface client is faster than a clock signal transmitted from the communication interface master to the first communication interface client.

5. The method of claim 1, wherein the first response is one byte long, and wherein the first response comprises at least one of a first read completion indication, first write completion indication, first read pending indication, first write pending indication, and a protocol error indication.

6. The method of claim 1, wherein the first communication interface client is configured to configure the first set of hardware registers based upon the first set of communication parameters to transmit the first response based on the first request in one or more units of one or more cycles of a clock of the communication interface master.

7. The method of claim 1, wherein the communication interface master is configured to receive first read data after receiving the first response.

8. The method of claim 1, further comprising receiving, by the first communication interface client from the communication interface master, a first predetermined training signal.

9. The method of claim 8, further comprising transmitting, by the first communication interface client to the communication interface master, a second predetermined training signal upon receiving the first predetermined training signal.

10. The method of claim 9, further comprising determining, by the communication interface master, the first communication interface client to be active upon receiving the second predetermined training signal.

11. An emulation system comprising:
a first serial communication interface client;
a communication interface master;
the first communication interface client configured to:
receive from the communication interface master a first set of communication parameters to configure subsequent communication between the first communication interface client and the communication interface master;
configure a first set of hardware registers associated with the first communication interface client based upon the received first set of communication parameters, wherein the first set of communication parameters comprises a first sampling rate and a first response delay;
receive from the communication interface master a first request through a first data connection between the communication interface master and the first communication interface client; and
transmit to the communication interface master a first response based on the first request in accordance with the first set of communication parameters.

12. The emulation system of claim 11, further comprising:
a second communication interface client configured to:
receive from the communication interface master a second set of communication parameters to configure subsequent communication between the second communication interface client and the communication interface master;
configure a second set of hardware associated with the second communication interface client based upon the received second set of communication parameters, wherein the second set of communication parameters comprises a second sampling rate and a second response delay;
receive client from the communication interface master a second request through a second data connection between the communication interface master and the second communication interface client; and
transmit to the communication interface master a second response based on the second request in accordance with the second set of communication parameters.

13. The emulation system of claim 11, wherein the first communication interface client is further configured to use an internal clock for over-sampling.

14. The emulation system of claim 13, wherein the internal clock of the first communication interface client is faster than a clock signal transmitted from the communication interface master to the first communication interface client.

15. The emulation system of claim 11, wherein the first response is one byte long, and wherein the first response comprises at least one of a first read completion indication, first write completion indication, first read pending indication, first write pending indication, and a protocol error indication.

16. The emulation system of claim 11, wherein the first communication interface client is configured to configure the first set of hardware registers based upon the first set of communication parameters to transmit the first response based on the first request in one or more units of one or more cycles of a clock of the communication interface master.

17. The emulation system of claim 11, wherein the communication interface master is configured to receive first read data after receiving the first response.

18. The emulation system of claim 11, wherein the first communication interface client is configured to receive a first predetermined training signal from the communication interface master.

19. The emulation system of claim 18, wherein the first communication interface client is configured to transmit a second predetermined training signal to the communication interface master upon receiving the first predetermined training signal.

20. The emulation system of claim 19, wherein the communication interface master is configured to determine that the first communication interface client is active upon receiving the second predetermined training signal.

* * * * *